(12) United States Patent
Gupta et al.

(10) Patent No.: US 11,277,133 B1
(45) Date of Patent: Mar. 15, 2022

(54) LEVEL SHIFTER WITH ISOLATION LOGIC

(71) Applicant: Arm Limited, Cambridge (GB)

(72) Inventors: Lalit Gupta, Cupertino, CA (US); El Mehdi Boujamaa, Valbonne (FR); Tirdad Anthony Takeshian, Vence (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/000,147

(22) Filed: Aug. 21, 2020

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC ........... H03K 19/0175; H03K 19/0185; H03K 19/018507; H03K 19/018514; H03K 19/018521; H03K 19/018528; H03K 3/02; H03K 3/023; H03K 3/0233; H03K 3/027; H03K 3/037; H03K 3/353; H03K 3/356; H03K 3/356008; H03K 3/356017; H03K 3/356026; H03K 3/356034; H03K 3/356043; H03K 3/356052; H03K 3/35606; H03K 3/356086; H03K 3/356095

See application file for complete search history.

(56) References Cited

U.S. PATENT DOCUMENTS

2009/0231013 A1* 9/2009 Jiang ............... H03K 19/018521
327/333

* cited by examiner

*Primary Examiner* — Diana J. Cheng
(74) *Attorney, Agent, or Firm* — Pramudji Law Group PLLC; Ari Pramudji

(57) ABSTRACT

Various implementations described herein are related to a device having level shifter circuitry configured to receive isolation control signals in a first voltage domain and provide an output signal in a second voltage domain that is different than the first voltage domain. The device may include isolation logic circuitry configured to receive a data input signal in the first voltage domain and then provide the isolation control signals to the level shifter circuitry in the first voltage domain based on the data input signal. The isolation logic circuitry may include control passgates that enable the data input signal to propagate to the level shifter circuitry via the isolation control signals.

20 Claims, 4 Drawing Sheets

LEVEL SHIFTER WITH ISOLATION LOGIC

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some physical architecture designs, conventional level shifting logic may not be efficient when operating in various functional modes. Also, due to technological scaling down in conventional designs, the maximum operating voltage that level shifting logic can withstand is also scaling down. Therefore, some conventional level shifting logic cannot withstand higher operating voltages and are thus deficient and relatively inadequate for typical modern uses. Hence, there exists a need to improve conventional circuit designs that can withstand higher operating voltages in various functional modes.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to various voltage level shifting schemes and techniques for physical layout design applications. For instance, the various schemes and techniques described herein may provide for level shifting architecture with efficient isolation logic that does not negatively impact speed in functional mode and with no DC path during isolation mode.

In some implementations, the voltage level shifting and isolation schemes and techniques described herein may provide a device with level shifter circuitry and isolation logic circuitry. The level shifter circuitry may include first transistors that are configured to receive isolation control signals in a first voltage domain and provide an output signal in a second voltage domain that is different than the first voltage domain. The isolation logic circuitry may include second transistors that are configured to receive a data input signal in the first voltage domain and then provide the isolation control signals to the level shifter circuitry in the first voltage domain based on the data input signal. The isolation logic circuitry may include control passgates that enable the data input signal to propagate to the level shifter circuitry via the isolation control signals. In some instances, the second voltage domain may be greater than the first voltage domain, and a difference between the first voltage domain and the second voltage domain may refer to an average voltage difference. Also, in some instances, the isolation logic circuitry operates independently of the first voltage domain and the data input signal.

Various implementations of voltage level shifting schemes and techniques will be described in detail herein with reference to FIGS. 1-4.

Figure 1:
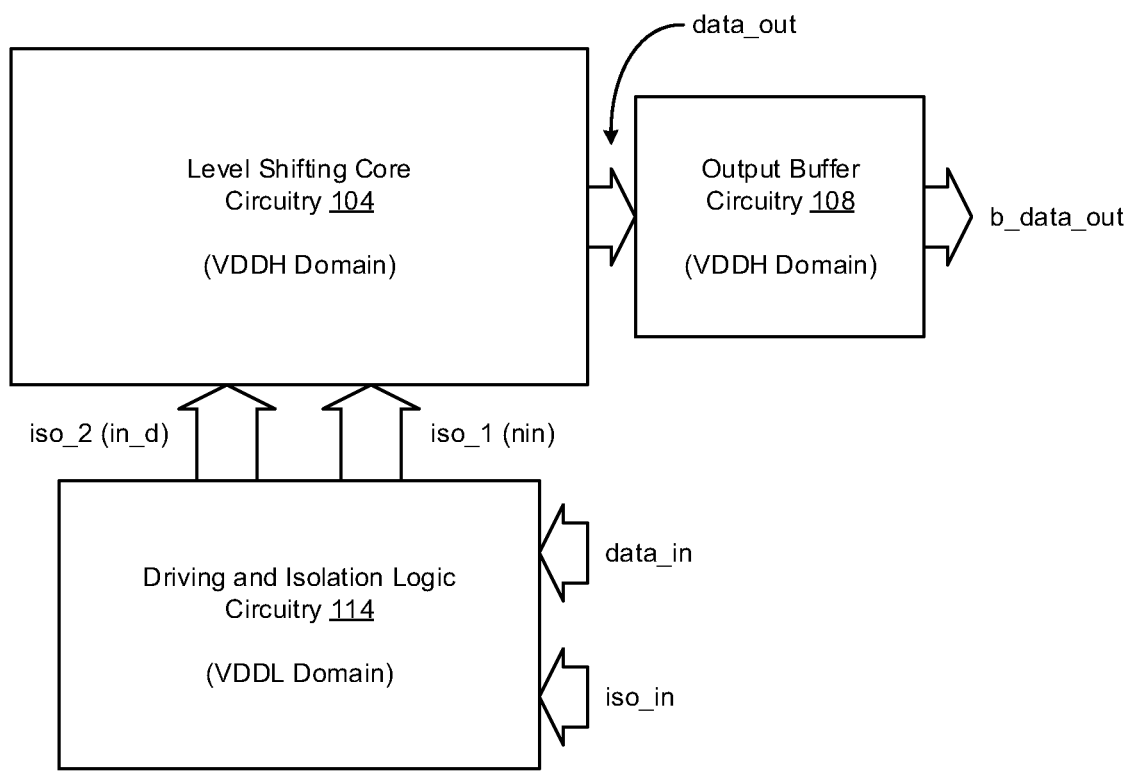
FIG. 1 illustrates a schematic diagram of level shifting architecture with driving and isolation logic in accordance with various implementations described herein.

FIG. 1 illustrates a diagram 100 of level shifting architecture 102 with driving and isolation logic 114 in accordance with various implementations described herein.

In various implementations, the level shifting architecture 102 may be used in a system or a device having various integrated circuit (IC) components that are arranged and coupled together as an assemblage or combination of parts that provide for a physical circuit design and related structures. In some instances, a method of designing, providing and fabricating the level shifting architecture 102 as an integrated system or device may involve use of various IC circuit components described herein so as to thereby implement various level shifting techniques associated therewith. The level shifting architecture 102 may be integrated with computing circuitry and related components on a single chip, and the level shifting architecture 102 may be implemented in various embedded systems for automotive, electronic, mobile and Internet-of-things (IoT) applications.

As shown in FIG. 1, the level shifting architecture 102 may include level shifting core circuitry 104 having first transistors that are configured to receive isolation control signals (iso_1, iso_2) in a first voltage domain (VDDL, e.g., a low voltage domain) and provide an output signal (data_out) in a second voltage domain (VDDH, e.g., a high voltage domain) that is different than the first voltage domain (VDDL). The second voltage domain (VDDH) may be greater than the first voltage domain (VDDL), wherein VDDH>VDDL. Also, the level shifting core circuitry 104 may include various logic circuitry that is configured to operate in the second voltage domain, such as, e.g., the VDDH domain.

In some instances, the difference between the first voltage domain (VDDL) and the second voltage domain (VDDH) refers to a voltage difference (VDDH−VDDL), such as, e.g., an average voltage difference. The range of the voltage difference may be, e.g., approximately 0.5V. The level shifting core circuitry may operate with an average 0.5V difference, and however, the difference may be higher depending on the sizing of the level shifting core circuitry 104. For instance, the level shifting core circuitry may operate in a 1.0V range.

The level shifting architecture 102 may also include driving and isolation logic circuitry 114 having second transistors that are configured to receive a data input signal (data_in) and/or an isolation input signal (iso_in) in the first voltage domain (VDDL) and provide the isolation control signals (iso_1, iso_2) to the level shifting core circuitry 104 in the first voltage domain (VDDL) based on the data input signal (data_in) and/or based on the isolation input signal (iso_in). Also, in some instances, the driving and isolation logic circuitry 114 may include one or more control passgates that enable the data input signal (data_in) to propagate to the level shifting core circuitry 104 via the isolation control signals (iso_1, iso_2). Also, in some instances, the driving and isolation logic circuitry 114 may operate independently of the first voltage domain (VDDL) and the data input signal (data_in). The driving and isolation logic circuitry 114 may include logic circuitry that is configured to operate in the first voltage domain, such as, e.g., the VDDL domain.

The level shifting architecture 102 may also include output buffer circuitry 108 that receives the output signal (data_out) in the second voltage domain (VDDH) from the level shifting core circuitry 104 and then provides a buffered output signal (b_data_out) in the second voltage domain (VDDH) as output from the level shifting architecture 102. Also, the output buffer circuitry 108 may include logic circuitry that is configured to operate in the second voltage domain, such as, e.g., the VDDH domain.

Figure 2:
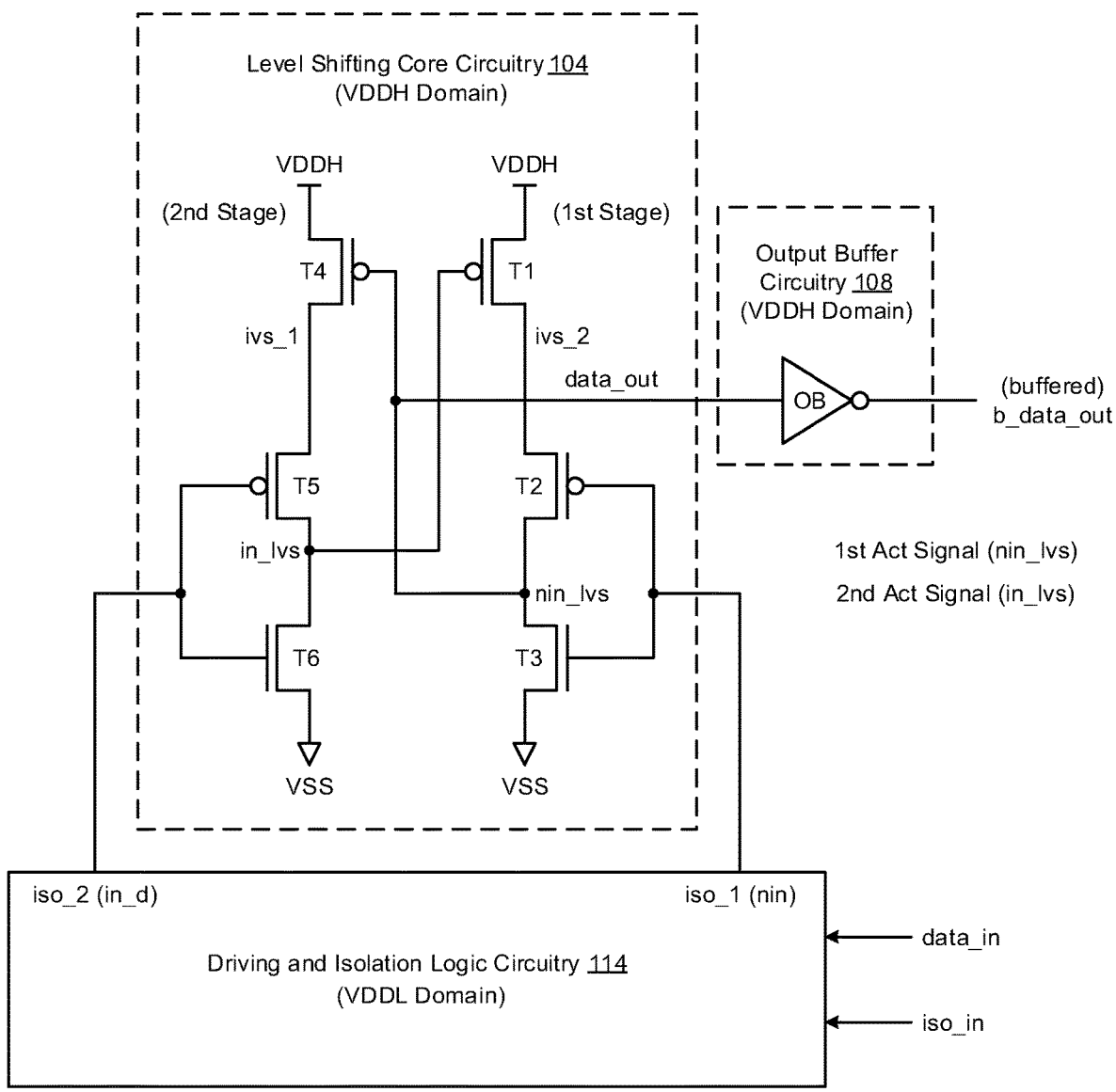
FIG. 2 illustrates a diagram of the level shifter architecture in accordance with various implementations described herein.

FIG. 2 illustrates a schematic diagram 200 of level shifting architecture 202 in accordance with various implementations described herein. In some implementations, the level shifting architecture 202 may include the level shifting core circuitry 104 (in FIG. 1) and the output buffer circuitry 108 (in FIG. 1). The level shifting core circuitry 104 may refer to a multi-stage level shifting core with driving and isolation logic circuitry (e.g., 114 in FIG. 1).

As shown in FIG. 2, the driving and isolation logic circuitry 114 is configured to receive the data input signal (data_in) in the first voltage domain (VDDL), receive the isolation input signal (iso_in) in the first voltage domain (VDDL), and provide a first isolation control signal (iso_1 (nin)) and a second isolation control signal (iso_2 (in_d)) in the first voltage domain (VDDL) based on the data input signal (data_in) and/or the isolation input signal (iso_in). In some instances, the driving and isolation logic circuitry 114 may include control passgates that enable the data input signal to propagate to the first logic circuit (1st stage) via the first isolation control signal (iso_1) and also propagate to the second logic circuit (2nd stage) via the second isolation control signal (iso_2). Further, the driving and isolation logic circuitry 114 is described in greater detail herein in reference to FIG. 3. Also, in some instances, the driving and isolation logic circuitry 114 may be configured to operate in the VDDL domain.

In some instances, the transistors (T1-T6) in the level shifting core circuitry 104 may be arranged in a first stage (1st stage) and a second stage (2nd stage), wherein the first stage (1st stage) may include transistors (T1-T3), and wherein the second stage (2nd stage) may include transistors (T4-T6). The first stage (1st stage) may be controlled by the first isolation control signal (iso_1) and an output (in_lvs) from the second stage (2nd stage), and also, the second stage (2nd stage) may be controlled by the second isolation control signal (in_lvs) and an output (nin_lvs) from the first stage (1st stage). The level shifting core circuitry 104 may be configured to operate in the VDDH domain.

Also, as shown in FIG. 2, the level shifting core circuitry 104 may include a first logic circuit (1st stage) that is configured to receive the first isolation control signal (iso_1) in the first voltage domain (VDDL) and provide a first activation signal (nin_lvs) in a second voltage domain (VDDH) based on the first isolation control signal (iso_1) in the first voltage domain (VDDL) and a second activation signal (in_lvs) in the second voltage domain. As such, the first stage (1st stage) may be referred to as the first logic circuit that is controlled by the first isolation control signal (iso_1) and the second activation signal (in_lvs) from the second logic circuit (2nd stage), and the second stage (2nd stage) may be referred to as the second logic circuit that is controlled by the second isolation control signal (iso_2) and the first activation signal (nin_lvs).

Also, as shown in FIG. 2, the level shifting core circuitry 104 may include a second logic circuit (2nd stage) that is configured to receive the second isolation control signal (iso_2) in the first voltage domain (VDDL) and receive the first activation signal (nin_lvs) in the second voltage domain (VDDH). The second logic circuit (2nd stage) may provide the second activation signal (in_lvs) in the second voltage domain (VDDH) to the first logic circuit (1st stage) and provide the output signal (data_out) in the second voltage domain (VDDH) based on the second isolation control signal (in_lvs) in the first voltage domain (VDDL) and the first activation signal (nin_lvs) in the second voltage domain (VDDH).

In some implementations, the first stage (1st stage) or first logic circuit includes a first set of stacked transistors (T1, T2, T3) coupled between voltage supply (VDDH) and ground (VSS). Transistor (T1) is coupled between VDDH and transistor (T2), and a gate of transistor (T1) is coupled to node (in_lvs). Transistor (T2) is coupled between transistor (T1) and transistor (T3), and a gate of transistor (T2) is coupled to node (iso_1). Transistor (T3) is coupled between transistor (T2) and ground (VSS), and a gate of transistor (T3) is coupled to node (iso_1). Transistor (T1) is configured to operate as a passgate that is activated by the second activation signal (in_lvs), and transistors (T2, T3) are configured to operate as an inverter that is activated by the first isolation signal (iso_1). The first activation signal (nin_lvs) is provided by node (nin_lvs) that is coupled between transistors (T2, T3). In some instances, transistors (T1, T2) refer to PMOS transistors, and transistor (T3) refers to an NMOS transistor. However, other configurations may be used.

In some implementations, the second stage (2nd stage) or second logic circuit includes a second set of stacked transistors (T4, T5, T6) coupled between voltage supply (VDDH) and ground (VSS). Transistor (T4) is coupled between VDDH and transistor (T5), and a gate of transistor (T4) is coupled to node (nin_lvs). Transistor (T5) is coupled between transistor (T4) and transistor (T6), and a gate of transistor (T5) is coupled to node (iso_2). Transistor (T6) is coupled between transistor (T5) and ground (VSS), and a gate of transistor (T6) is coupled to node (iso_2). Transistor (T4) is configured to operate as a passgate that is activated by the first activation signal (nin_lvs), and transistors (T5, T6) are configured to operate as an inverter that is activated by the second isolation signal (iso_2). The second activation signal (in_lvs) is provided by node (in_lvs) that is coupled between transistors (T5, T6). In some instances, transistors (T4, T5) refer to PMOS transistors, and transistor (T6) refers to an NMOS transistor. However, other configurations may be used.

Also, as shown in FIG. 2, the level shifting core circuitry 104 may include the output buffer circuitry 108 that is coupled between the internal node (nin_lvs) and the output node (b_output_data). In some implementations, the output buffer circuitry 108 includes buffer logic, such as, e.g., an inverter (OB), that is configured to receive the data output signal (data_out) in the VDDH domain at node (nin_lvs) and then provide a buffered data output signal (b_data_out) in the VDDH domain. Also, in some instance, an internal node (ivs_1) may be provided between transistors (T4, T5), and another internal node (ivs_2) may be provided between transistors (T1, T2). Also, in some instances, the output buffer circuitry 108 may be configured to operate in the VDDH domain.

Figure 3:
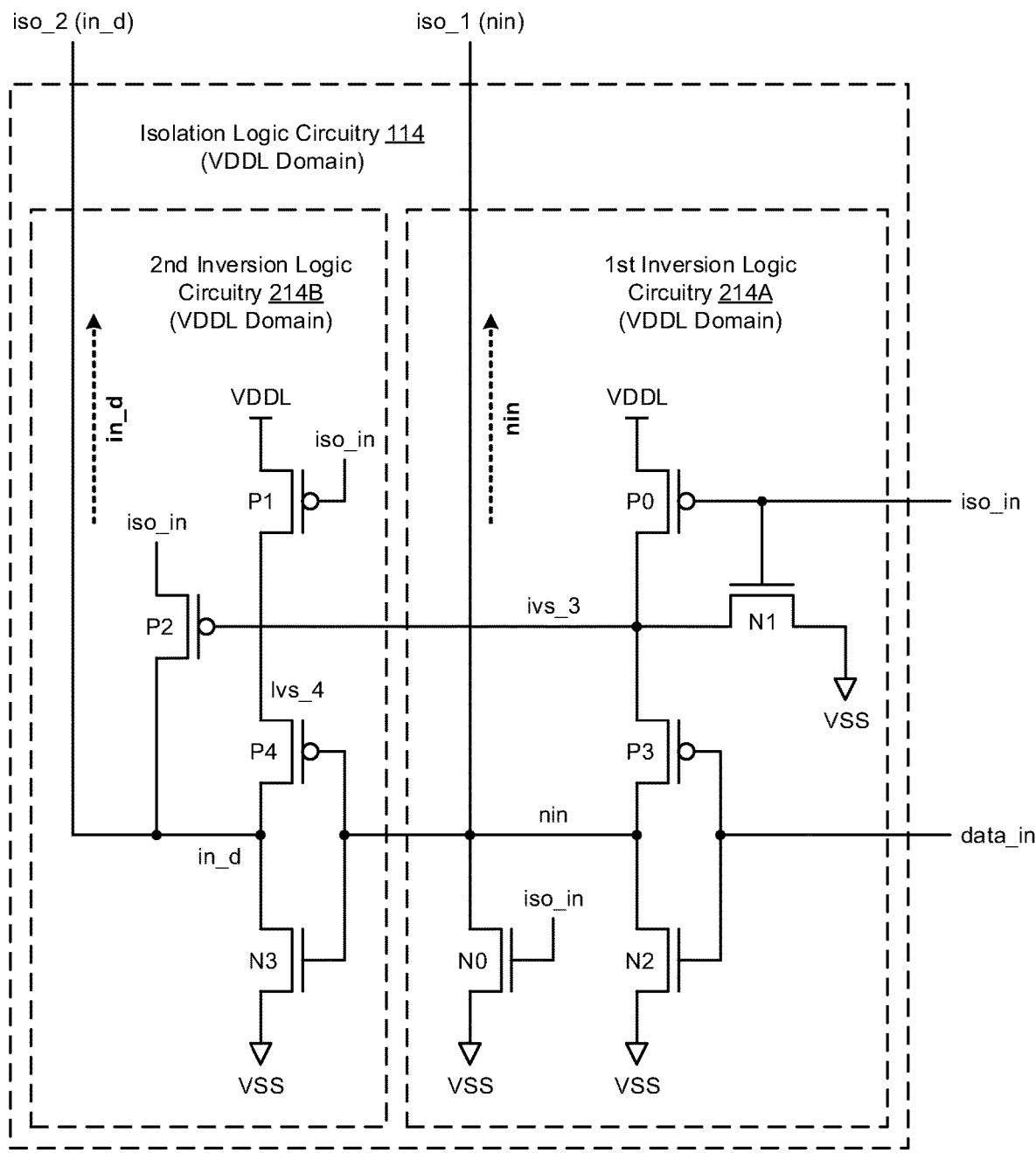
FIG. 3 illustrates a schematic diagram of driving and isolation logic circuitry in accordance with various implementations described herein.

FIG. 3 illustrates a diagram of the driving and isolation logic circuitry 114 in accordance with various implementations described herein.

As shown in FIG. 3, the driving and isolation logic circuitry 114 may include multiple sets of control passgates (P0-P4, N0-N3) that enable the data input signal (data_in) to propagate to the level shifting core circuitry 104 via the isolation control signals (iso_1, iso_2). The driving and isolation logic circuitry 114 may include first inversion logic circuitry 214A and second inversion logic circuitry 214B that are coupled in series to receive the data input signal (data_in) and then provide the isolation control signals (iso_1, iso_2) to the level shifting core circuitry 104 based on the data input signal (data_in) and/or the isolation input signal (iso_in). The isolation control signals (iso_1, iso_2) may include the first isolation control signal (iso_1) that is provided by the first inversion logic circuitry 214A based on the data input signal (data_in) and/or the isolation input signal (iso_in), and also the isolation control signals (iso_1, iso_2) may include a second isolation control signal (iso_2) that is provided by the second inversion logic circuitry 2148 based on the first isolation control signal (iso_1) and/or the isolation input signal (iso_in). In various instances, the driving and isolation logic circuitry 114, 302A may be configured to operate in the VDDL domain (i.e., low voltage domain). Also, in some instances, the driving and isolation logic circuitry 114 may operate independently of VDDL and the data input (data_in), and the driving and isolation logic circuitry 114 may operate to force nin=0 and in_d=logic high.

In some implementations, the first inversion logic circuitry 214A may include one or more first passgates (P0, P3, N0, N1, N2) of the control passgates (P0-P4, N0-N3) that enable the data input signal (data_in) to propagate to the first stage (1st stage) of the level shifting core circuitry 104 via the first isolation control signal (iso_1). The first inversion logic 214A may be configured to operate in the VDDL domain.

As shown in FIG. 3, the first inversion logic 214A may include transistors (P0, P3, N2) that are coupled between the voltage supply (VDDL) in the first voltage domain (VDDL) and ground (VSS). Transistor (P0) may be coupled between VDDL and transistor (P3), and a gate of transistor (P0) may be coupled to node (iso_in), and transistor (P0) may be enabled with the isolation input signal (iso_in). Transistor (P3) may be coupled between transistors (P0, N2), and a gate of transistor (P3) may be coupled to node (data_in), and also, transistor (N2) may be activated by the data input signal (data_in). Transistor (N2) may be coupled between transistor (P3) and ground (VSS), and a gate of transistor (N2) may be coupled to node (data_in), and transistor (N2) may be activated by the data input signal (data_in). Also, transistor (N1) may be coupled between node (ivs_3) and ground (VSS), and a gate of transistor (N1) may be coupled to node (iso_in), and transistor (N1) may be enabled with the isolation input signal (iso_in). Transistor (N0) may be coupled between node (nin) and ground (VSS), and a gate of transistor (N0) may be coupled to node (iso_in), and transistor (N0) may be enabled with the isolation input signal (iso_in). Transistors (P3, N2) may be configured to operate as an inverter that is activated by the data input signal (data_in), and node (ivs_3) may be coupled between transistors (P0, P3). Also, transistors (P0, P3) may refer to PMOS transistors, and transistors (N0, N1, N2) may refer to NMOS transistors. However, other configurations may be used.

In some implementations, the second inversion logic circuitry 2148 may include one or more second passgates (P1, P2, P4, N3) of the control passgates (P0-P4, N0-N3) that enable the data input signal (data_in) to propagate to the second stage (2nd stage) of the level shifting core circuitry 104 via the second isolation control signal (iso_2). The second inversion logic 2148 may be configured to operate in the VDDL domain.

As shown in FIG. 3, the second inversion logic 2148 may include transistors (P1, P4, N3) that are coupled between the voltage supply (VDDL) in the first voltage domain (VDDL) and ground (VSS). Transistor (P1) may be coupled between VDDL and transistor (P4), and a gate of transistor (P1) may be coupled to node (iso_in), and transistor (P1) may be enabled with the isolation input signal (iso_in). Transistor (P4) may be coupled between transistors (P1, N3), and a gate of transistor (P4) may be coupled to node (nin), and also, transistor (P4) may be activated by the first isolation control signal (iso_1) at node (nin). Transistor (N3) may be coupled between transistor (P4) and ground (VSS), and a gate of transistor (N3) may be coupled to node (nin), and transistor (N3) may be activated by the first isolation control signal (iso_1) at node (nin). Also, transistor (P2) may be coupled between node (iso_in) and node (in_d), and a gate of transistor (P2) may be coupled to node (ivs_3), and transistor (P2) may be activated with the ivs_3 signal. Transistors (P4, N3) may be configured to operate as an inverter that is activated by the first isolation control signal (iso_1) at node (nin), and node (in_d) may be coupled between transistors (P4, N3). Also, in some instances, transistors (P1, P2, P4) may refer to PMOS transistors, and transistor (N3) may refer to an NMOS transistor. However, various other configurations may be used.

In various implementations, the isolation logic circuitry 114 may be configured to provide the isolation control signals (iso_1, iso_2) to the level shifting core circuitry 104 based on the data input signal (data_in) and/or the isolation input signal (iso_in). Thus, the first inversion logic circuitry 214A is configured to provide the first isolation control signal (iso_1) to the level shifting core circuitry 104 via node (nin). Further, the second inversion logic circuitry 2148 is configured to provide the second isolation control signal (iso_2) to the level shifting core circuitry 104 via node (in_d).

In various implementations, when the isolation input signal (iso_in) is at a logic zero level (i.e., iso_in=0), the level shifting core circuitry 104 is enabled, and data is then transmitted to the level shifting core inputs, e.g., as shown in Table 1 below.

TABLE 1

| nets | value | transistor | state |
| --- | --- | --- | --- |
| Ivs_3 | VDDL | P0 | ON |
| Ivs_4 | VDDL | P1 | ON |
| in_n | ndata | P2 | OFF |
| in_d | data | N0 | OFF |

In various implementations, when the isolation input signal (iso_in) is at a logic one level (i.e., iso_in=1), the level shifting core circuitry 104 in an isolation state, and then data is blocked, e.g., as shown in Table 2 below.

TABLE 2

| nets | value | transistor | state |
|---|---|---|---|
| lvs_3 | VSS (Gnd) = 0 V | P0 | OFF |
| lvs_4 | iso = VDDL | P1 | OFF |
| in_n | VSS (Gnd) = 0 V | P2 | ON |
| in_d | iso = VDDL | N0 | ON |

Figure 4:
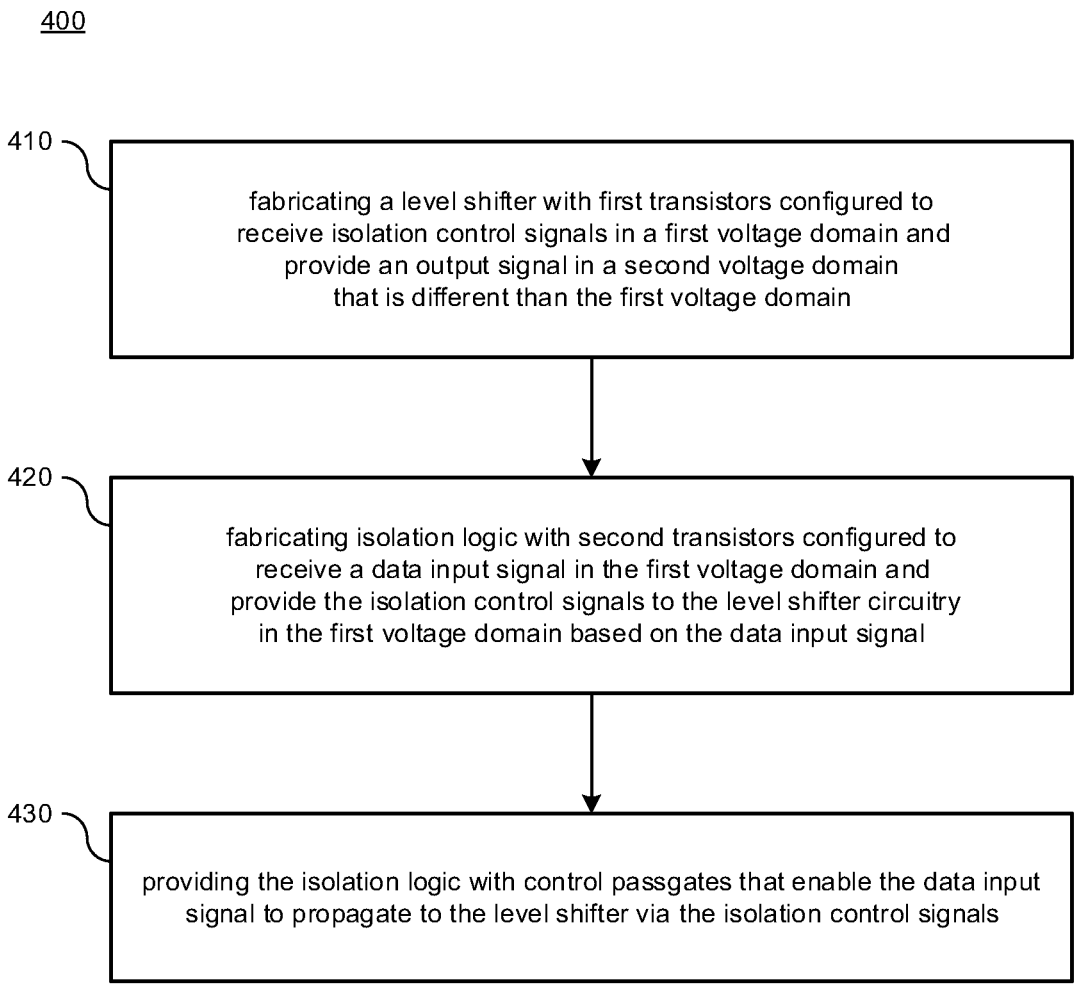
FIG. 4 illustrates a diagram of a method for providing level shifting circuitry in accordance with implementations described herein.

FIG. 4 illustrates a process diagram 400 of a method 402 for providing level shifting circuitry in accordance with implementations described herein.

It should be understood that even though method 400 indicates a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, method 400 may be implemented as a program and/or software instruction process configured for providing various level shifting schemes and techniques, as described herein. Also, if implemented in software, instructions related to implementing method 400 may be stored in memory and/or a database. For instance, various types of computing devices having a processor and memory may be configured to perform method 400.

In various implementations, method 400 may refer to a method of designing, providing, fabricating and/or manufacturing level shifting circuitry as an integrated system, device and/or circuit that may involve use of the various IC circuit components described herein so as to implement level shifting schemes and techniques associated therewith. In some instances, the level shifting circuitry may be integrated with computing circuitry and related components on a single chip, and the level shifting circuitry may be implemented in various embedded systems for various electronic, mobile and Internet-of-things (IoT) applications including remote sensor nodes.

At block 410, method 400 may fabricate a level shifter with first transistors that are configured to receive isolation control signals in a first voltage domain and provide an output signal in a second voltage domain that is different than the first voltage domain. In some instances, the first voltage domain may refer to a low voltage domain (VDDL), and the second voltage domain may refer to a high voltage domain (VDDH) that is greater than the first voltage domain (VDDL). At block 420, method 400 may fabricate isolation logic with second transistors that are configured to receive a data input signal in the first voltage domain and provide the isolation control signals to the level shifter circuitry in the first voltage domain based on the data input signal. At block 430, method 400 may provide the isolation logic with control passgates that enable the data input signal to propagate to the level shifter via the isolation control signals.

In some implementations, a difference between the first voltage domain (VDDL) and the second voltage domain (VDDH) may refer to a voltage difference (VDDH−VDDL), such as, e.g., an average voltage difference. The range of the voltage difference may be, e.g., approximately 0.5V. The level shifter may operate with an average 0.5V difference, and however, the voltage difference may be higher depending on sizing of the level shifter circuitry. For instance, the level shifter circuitry may operate in a 1.0V range. Further, in some instances, if VDDH turns out to be lower than VDDL (i.e., if VDDH<VDDL), then the level shifter circuitry may be operating properly.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include level shifter circuitry having first transistors configured to receive isolation control signals in a first voltage domain and provide an output signal in a second voltage domain that is different than the first voltage domain. The device may include isolation logic circuitry having second transistors configured to receive a data input signal in the first voltage domain and then provide the isolation control signals to the level shifter circuitry in the first voltage domain based on the data input signal. The isolation logic circuitry may include control passgates that enable the data input signal to propagate to the level shifter circuitry via the isolation control signals.

Described herein are various implementations of a level shifter. The level shifter may include an isolation circuit configured to provide a first isolation signal and a second isolation signal in a first voltage domain based on a data input signal. The level shifter may include a first logic circuit configured to provide a first activation signal in a second voltage domain based on the first isolation signal in the first voltage domain and based on a second activation signal in the second voltage domain. The level shifter may include a second logic circuit configured to provide the second activation signal in the second voltage domain to the first logic circuit and provide an output signal in the second voltage domain based on the second isolation signal in the first voltage domain and based on the first activation signal in the second voltage domain.

Described herein are various implementations of a method. The method may provide or fabricate a level shifter with first transistors configured to receive isolation control signals in a first voltage domain and provide an output signal in a second voltage domain that is different than the first voltage domain. The method may provide or fabricate isolation logic with second transistors configured to receive a data input signal in the first voltage domain and then provide the isolation control signals to the level shifter circuitry in the first voltage domain based on the data input signal. The isolation logic may have control passgates that enable the data input signal to propagate to the level shifter via the isolation control signals.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   level shifter circuitry having first transistors configured to receive isolation control signals in a first voltage domain and provide an output signal in a second voltage domain that is different than the first voltage domain; and
   isolation logic circuitry having second transistors configured to receive a data input signal in the first voltage domain, receive an isolation input signal in the first voltage domain, and then provide the isolation control signals to the level shifter circuitry in the first voltage domain based on the data input signal and the isolation input signal,
   wherein the isolation logic circuitry includes control passgates that enable the data input signal to propagate to the level shifter circuitry via the isolation control signals.

2. The device of claim 1, wherein the second voltage domain is greater than the first voltage domain.

3. The device of claim 1, wherein a difference between the first voltage domain and the second voltage domain refers to an average voltage difference.

4. A device, comprising:
   level shifter circuitry having first transistors configured to receive isolation control signals in a first voltage domain and provide an output signal in a second voltage domain that is different than the first voltage domain; and
   isolation logic circuitry having second transistors configured to receive a data input signal in the first voltage domain and then provide the isolation control signals to the level shifter circuitry in the first voltage domain based on the data input signal,
   wherein the isolation logic circuitry includes control passgates that enable the data input signal to propagate to the level shifter circuitry via the isolation control signals, and
   wherein the isolation logic circuitry includes first inversion logic and second inversion logic that are coupled in series to receive the data input signal and then provide the isolation control signals to the level shifter circuitry based on the data input signal.

5. The device of claim 4, wherein the isolation control signals include a first isolation control signal provided by the first inversion logic based on the data input signal, and wherein the isolation control signals include a second isolation control signal provided by the second inversion logic based on the first isolation control signal.

6. The device of claim 5, wherein the first transistors of the level shifter circuitry are arranged in a first stage and a second stage, wherein the first stage is activated by the first isolation control signal and an output from the second stage, and wherein the second stage is activated by the second isolation control signal and an output from the first stage.

7. The device of claim 6, wherein the first inversion logic includes one or more first passgates of the control passgates that enable the data input signal to propagate to the first stage of the level shifter circuitry via the first isolation control signal.

8. The device of claim 7, wherein the second inversion logic includes one or more second passgates of the control passgates that enable the data input signal to propagate to the second stage of the level shifter circuitry via the second isolation control signal.

9. A device, comprising:
   level shifter circuitry having first transistors configured to receive isolation control signals in a first voltage domain and provide an output signal in a second voltage domain that is different than the first voltage domain; and
   isolation logic circuitry having second transistors configured to receive a data input signal in the first voltage domain and then provide the isolation control signals to the level shifter circuitry in the first voltage domain based on the data input signal, wherein the isolation logic circuitry includes control passgates that enable the data input signal to propagate to the level shifter circuitry via the isolation control signals, and wherein the isolation logic circuitry operates independently of the first voltage domain and the data input signal.

10. The device of claim 1, further comprising:

output buffer circuitry that receives the output signal in the second voltage domain from the level shifter circuitry and provides a buffered output signal in the second voltage domain as output from the device.

11. A level shifter, comprising:

an isolation circuit configured to provide a first isolation signal and a second isolation signal in a first voltage domain based on a data input signal;

a first logic circuit configured to provide a first activation signal in a second voltage domain based on the first isolation signal in the first voltage domain and based on a second activation signal in the second voltage domain; and a second logic circuit configured to provide the second activation signal in the second voltage domain to the first logic circuit and provide an output signal in the second voltage domain based on the second isolation signal in the first voltage domain and based on the first activation signal in the second voltage domain.

12. The level shifter of claim 11, wherein the second voltage domain is greater than the first voltage domain, and wherein a difference between the first voltage domain and the second voltage domain refers to an average voltage difference.

13. The level shifter of claim 11, wherein the isolation circuit has first inversion logic and second inversion logic that are coupled in series to receive the data input signal and provide the first isolation signal to the first logic circuit and provide the second isolation signal to the second logic circuit based on the data input signal.

14. The level shifter of claim 13, wherein the first isolation signal is provided by the first inversion logic based on the data input signal, and wherein the second isolation signal is provided by the second inversion logic based on the first isolation signal.

15. The level shifter of claim 14, wherein the first logic circuit is controlled by the first isolation signal and the second activation signal from the second logic circuit, and wherein the second logic circuit is controlled by the second isolation signal and the first activation signal.

16. The level shifter of claim 15, wherein:

the isolation circuit includes control passgates that enable the data input signal to propagate to the first logic circuit via the first isolation signal and also propagate to the second logic circuit via the second isolation signal, the first inversion logic includes one or more first passgates of the control passgates that enable the data input signal to propagate to the first logic circuit via the first isolation signal, and the second inversion logic includes one or more second passgates of the control passgates that enable the data input signal to propagate to the second logic circuit via the second isolation signal.

17. The level shifter of claim 11, wherein the isolation circuit is configured to operate independently of the first voltage domain and the data input signal.

18. The level shifter of claim 11, further comprising:

an output buffer circuit that receives the output signal in the second voltage domain from the first logic circuit and provides a buffered output signal in the second voltage domain as output from the level shifter.

19. A method, comprising:

fabricating a level shifter with first transistors configured to receive isolation control signals in a first voltage domain and provide an output signal in a second voltage domain that is different than the first voltage domain; and fabricating isolation logic with second transistors configured to receive a data input signal in the first voltage domain and then provide the isolation control signals to the level shifter circuitry in the first voltage domain based on the data input signal, wherein the isolation logic has control passgates that enable the data input signal to propagate to the level shifter via the isolation control signals, and wherein the isolation logic operates independently of the first voltage domain and the data input signal.

20. The method of claim 19, wherein the second voltage domain is greater than the first voltage domain, and wherein a difference between the first voltage domain and the second voltage domain refers to an average voltage difference.

* * * * *